(12) United States Patent
Mitra et al.

(10) Patent No.: US 7,421,610 B2
(45) Date of Patent: Sep. 2, 2008

(54) CLOCK GENERATION CIRCUIT

(75) Inventors: Arnab K. Mitra, Uttar Pradesh (IN);
Amrit Singh, Punjab (IN); Nitin Vig,
New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 376 days.

(21) Appl. No.: 11/370,381

(22) Filed: Mar. 6, 2006

(65) Prior Publication Data
US 2007/0022312 A1    Jan. 25, 2007

(30) Foreign Application Priority Data
Jul. 21, 2005    (IN) .................... 1913/DEL/2005

(51) Int. Cl.
*G06F 1/00*    (2006.01)
*G06F 1/04*    (2006.01)
*G06F 1/12*    (2006.01)
(52) U.S. Cl. .................... 713/500; 713/400; 713/600
(58) Field of Classification Search .................. 713/500, 713/400, 600
See application file for complete search history.

(56) References Cited

U.S. PATENT DOCUMENTS

| 6,518,788 | B2 | 2/2003 | Kasahara | |
| 6,539,509 | B1 | 3/2003 | Teene | |
| 6,895,523 | B2 * | 5/2005 | Otsuka | 713/401 |
| 7,082,546 | B2 * | 7/2006 | Schoch | 713/500 |
| 2005/0289379 | A1 * | 12/2005 | Teutsch et al. | 713/400 |

FOREIGN PATENT DOCUMENTS

| JP | 10-177060 | 6/1998 |
| JP | 2003-216671 | 7/2003 |

* cited by examiner

*Primary Examiner*—Rehana Perveen
*Assistant Examiner*—Stefan Stoynov
(74) *Attorney, Agent, or Firm*—Charles Bergere

(57) ABSTRACT

A clock generation circuit for an integrated circuit device, such as an SOC, has increased test coverage. The clock generation circuit includes first and second latches that receive an input clock signal at their clock inputs and a selector that receives at first and second data inputs respectively, the input clock signal and an output of the second latch circuit, which is a divided clock signal. A logic gate has a first input connected to an output of the first latch and a second input that receives a scan mode signal. The logic gate generates a selector control signal provided to the selector.

9 Claims, 3 Drawing Sheets

US 7,421,610 B2

CLOCK GENERATION CIRCUIT

BACKGROUND OF THE INVENTION

The present invention relates generally to testable integrated circuits and, in particular, to a method for generating a clock signal in a testable integrated circuit.

Today's integrated circuits include hundreds of thousands of transistors, which form various logic elements such as adders, multipliers, buffers, registers, etc. All of these transistors must be tested to ensure that the integrated circuit will function according to its intended purpose. Due to the large numbers of transistors and high design costs, integrated circuits must be designed for test (DFT). Specific design approaches have evolved to make devices more readily testable, such as Built in Self Test (BIST) and scan testing. Scan testing aims to achieve total or near total controllability and observability in sequential circuits. In scan testing, circuit elements are linked together in one or more chains and then a test pattern is clocked (passed) though the chain. If the output pattern matches the input pattern, it can be deduced that the circuit elements do not contain faults.

As the functional requirements for integrated circuits have become more demanding, the requirements to be met by the clock controller module of the IC have become very stringent. A typical clock controller may be required to process the clocks from multiple PLLs, generate clocks for the core, bus master and slaves, and generate baud clocks for peripherals like USB, SSI, image processor, UART, multimedia card, camera sensor, GPS, etc. The clock controller must also control the clocks during Dynamic Voltage Frequency Scaler (DVFS) and low power modes, and generate chopped clock patterns for at-speed scan testing. In order to meet these demands, multiple clock dividers and multiplexers are used, such that traditional techniques used for clock balancing are impacting design time and chip performance.

FIG. 1 shows a typical clock tree of an integrated circuit 10. The circuit 10 includes multiple dividers, such as DVFS divider 12, core divider 14, Advanced High Performance Bus (AHB) divider 16, and IP divider 18. A test clock (test_clock) is multiplexed with the functional clocks (p110, p111, p112, and p113) via muxes 20, 24, 26, 28, 30 and 32. These muxes are used to differentiate between the functional clocks and the test clock before the respective clock dividers 12-18 for test purposes. The addition of so much test circuitry adds to the clock latency and power consumption, and also to the difficulty in balancing the clock latency, which increases the design cycle. Furthermore, bypassing of clock circuitry during scan makes it difficult to test the clock generation logic.

Referring to FIG. 2, a conventional clock divider circuit 40 used in an integrated circuit is shown. The clock divider circuit 40 includes first and second flip-flops 42 and 44, a plurality of buffers 46, and first and second selectors 48 and 50. An input clock signal, clock_in, is input to the clock divider circuit 40 and provided to the clock inputs of the first and second flip-flops 42 and 44, and also as a data input by way of a pair of the buffers 46 to the first selector 48. The other data input to the first selector 48 is the output of the second flip-flop 44, by way of a pair of the buffers 46. The data output of the first flip-flop 42 is provided, by way of a pair of the buffers 46, to the address or control input of the first selector 48. Thus, the first selector 48 outputs either a buffered clock signal or a divided clock signal. The second selector 50 receives as data inputs the output of the first selector 48 and a test_clock signal. One of the output signals of the first selector 48 and the test_clock signal are selected by the second selector 50 depending on a scan_mode signal. Thus, in scan mode, the test_clock is selected and in normal mode, the clk_out signal is selected.

While the clock divider circuit 40 functions adequately, the second selector 50 increases clock latency. In addition, the test coverage afforded by the divider circuit 40 is less than adequate because the buffers 46 are bypassed. Thus, the buffers 46 and the first selector 48 are not testable.

It would be desirable, at least for components such as SOCs, to provide a clock divider circuit that is tested as comprehensively as possible.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a clock generation circuit for an integrated circuit device, such as an SOC, that has increased test coverage. The clock generation circuit includes first and second latches that receive an input clock signal at their clock inputs and a selector that receives at first and second data inputs respectively, the input clock signal and an output of the second latch circuit, which is a divided clock signal. A logic gate has a first input connected to an output of the first latch and a second input that receives a scan mode signal. The logic gate generates a selector control signal provided to the selector.

Figure 3:
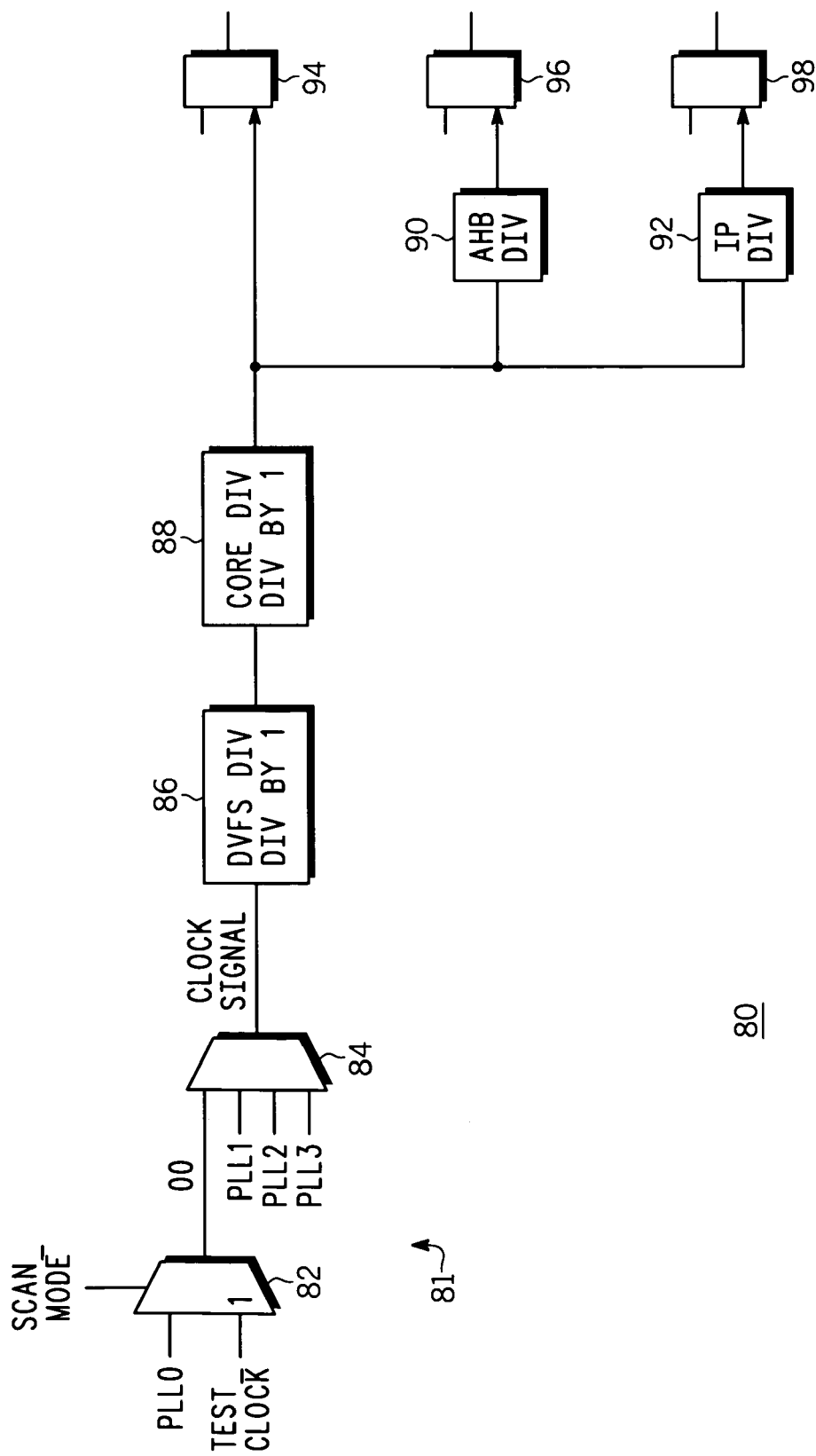
FIG. 3 is a schematic block diagram of a clock tree in an integrated circuit in accordance with an embodiment of the present invention.

Referring now to FIG. 3, a schematic block diagram of an IC 80, such as a SOC is shown. The IC 80 includes a clock tree 81 comprising first and second selectors 82 and 84. The clock tree 81 provides a clock signal to a plurality of divider circuits, such as a DVFS divider 86, a core divider 88, an AHB divider 90 and an IP divider 92. Although the IC 80 has 4 dividers 86-92, it will be understood by those of skill in the art that the IC 80 could have more or fewer divider circuits. Preferably, a plurality of latches is connected to the divider circuits at the outer boundaries thereof. More particularly, a first latch 94 is connected to an output of the core divider 88, a second latch 96 is connected to an output of the AHB divider 90, and a third latch 98 is connected to an output of the IP divider 92. The first, second and third latches 94-98 act as clock sinks. That is, the latches 94-98 are points where the clock path terminates. It will be understood by those of skill in the art that in an actual SOC, a plurality of sink latches would be coupled to the dividers as sinks. Thus, the first, second and third latches 94-98 are representative of pluralities of latches.

In the embodiment shown, a first clock signal p110 and a test clock (test_clk) are provided to a first selector 82. A control signal (scan_mode) selects one of the first clock signal and the test clock to be output by the first selector 82. The first selector 82 is connected to a second selector 84. The second selector 84 also receives as inputs a plurality of other clock signals, namely p111, p112 and p113. The clock signals p110-p113 may be generated by a PLL circuit (not shown), as is known by those of skill in the art. Note that the only test clock muxing is performed at the first selector 82 and after that, the test clock is received by the other circuits along the functional clock path. That is, the test clock and functional clock path are the same after the first selector 82.

The clock signal output by the second selector 84 is input to the DVFS divider circuit 86. In scan mode, the test clock is selected and output by the first selector 82 and passed though the second selector 84 to the divider circuit 86. The test clock is then forced through the combinatorial logic of the divider circuit 86, and similarly through the combinatorial logic of the other dividers 88-92.

In comparison to the prior art clock tree circuit 10, the clock tree of the present invention does not include a test clock mux before each of the divider circuits such that there is only a single, initial multiplexer that receives the test clock signal and forces the test clock signal through the logic circuitry. Further, the clock signal is passed through the divider circuits 86-92, so the circuits consume less power and have lower clock latency. Thus, an integrated circuit using a clock tree of the present invention is easier to design because there is just one clock signal to balance.

Figure 1:
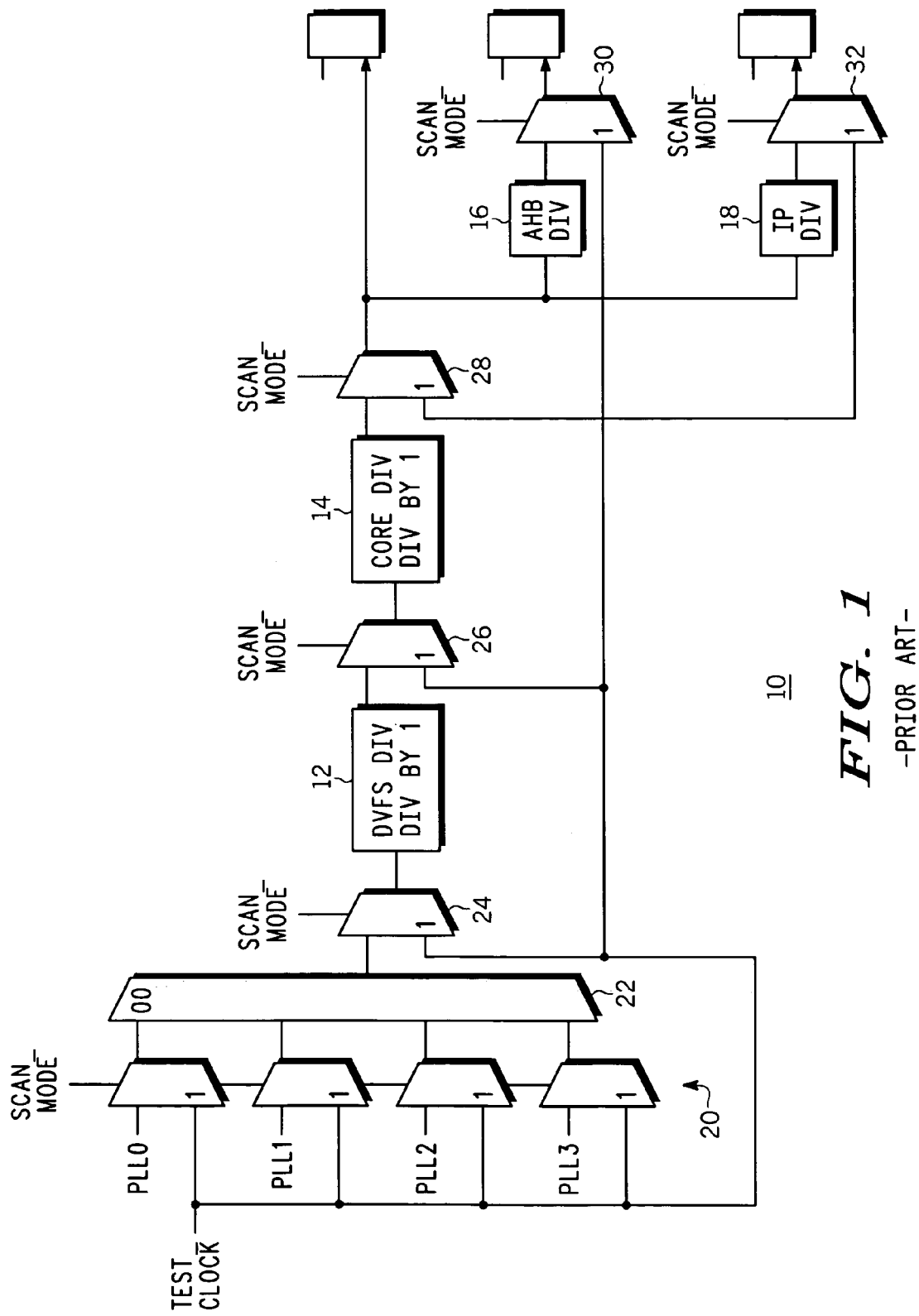
FIG. 1 is a schematic block diagram of a clock tree of a conventional integrated circuit device.
Figure 2:
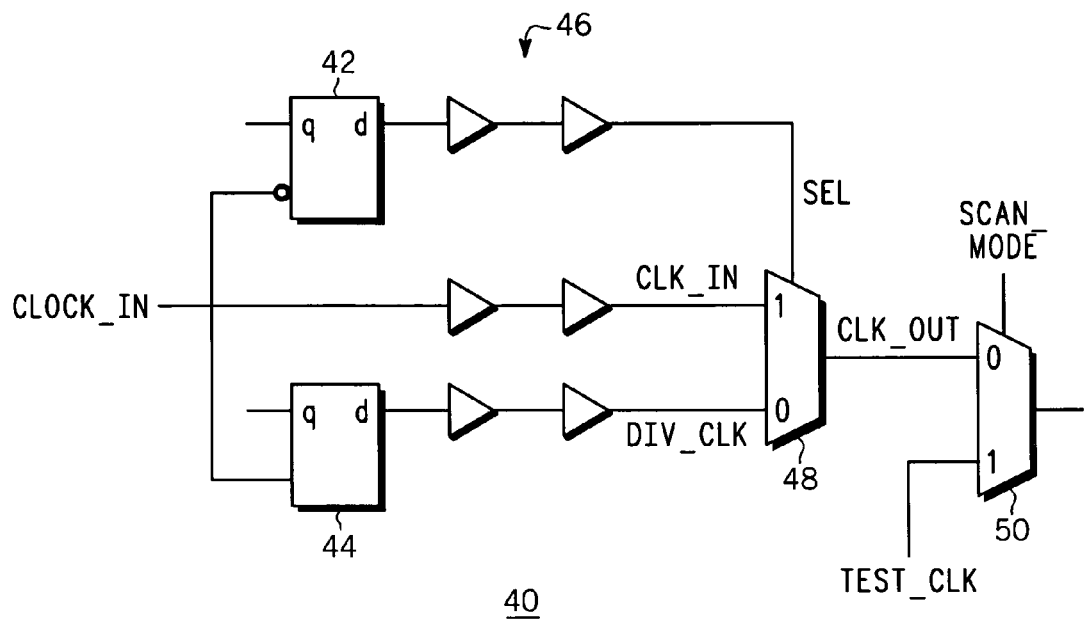
FIG. 2 is a schematic block diagram of a conventional clock divider circuit used in integrated circuits.
Figure 4:
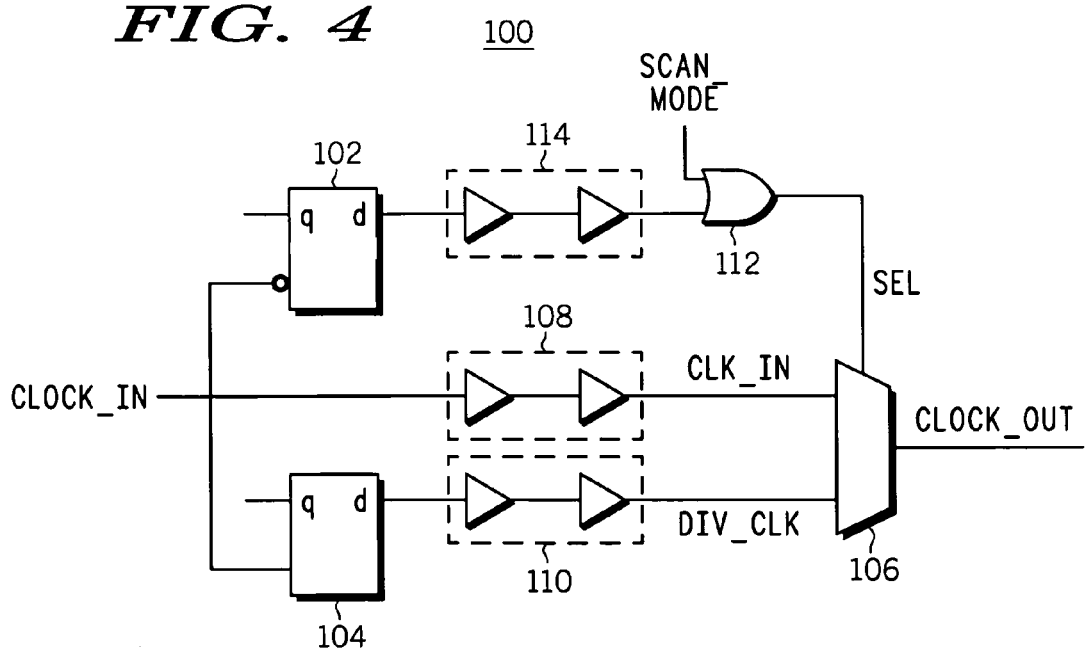
FIG. 4 is a schematic block diagram of a clock divider circuit in accordance with an embodiment of the present invention.

FIG. 4 is a schematic block diagram of a clock generation circuit 100 in accordance with an embodiment of the present invention. The clock generation circuit 100 is particularly useful for VLSI, such as an SOC, which benefit greatly by having circuits with increased test coverage. The clock generation circuit 100 includes first and second latch circuit 102 and 104 that receive an input clock signal, clock_in, at their clock inputs and a selector circuit 106 that receives at first and second data inputs thereof, respectively, the input clock signal and an output of the second latch circuit 104.

The clock_in signal provided to the selector circuit 106 is preferably buffered by a first plurality of series connected buffers 108. A first buffer of the first plurality of buffers 108 receives the input clock signal and a last buffer of the first plurality of buffers 108 outputs a buffered input clock signal, clk_in, which is input to the selector circuit 106. A second plurality of series connected buffers 110 are connected between the output of the second latch circuit 104 and the input of the selector circuit 106. A first buffer of the second plurality of buffers 110 receives the output of the second latch circuit 104 and a last buffer of the second plurality of buffers 110 outputs a divided clock signal, div_clk. As will be understood by those of skill in the art, the second latch 104 is used to generate a divided clock signal.

The first latch circuit 102 is used to generate a selector control signal that is provided to a control or address input of the selector circuit 106. A logic gate 112 having a first input connected to an output of the first latch circuit 102 and a second input that receives a scan mode signal, generates a selector control signal that is input to a control or address input of the selector 106. The selector control signal causes the selector 106 to select one of the clk_in signal or the div_clk signal. The logic gate 112 performs a logic OR operation and may be formed using any combination of logic gates, such as NAND, NOR and NOT gates.

In one embodiment of the invention, a third plurality of series connected buffers 114 are connected between the first latch circuit 102 and the logic gate 112. A first buffer of the third plurality of buffers 114 receives the output of the first latch circuit 102 and a last buffer of the third plurality of buffers 114 is connected to an input of the logic gate 112.

The first, second and third pluralities of buffers 108, 110 and 114 may comprise any numbers of series connected buffers for a particular design. In the embodiment shown, each of the first, second and third pluralities of buffers 108, 110 and 114 may comprises two buffers. However, the present invention should not be limited by the number of series connected buffers in each of these pluralites.

As previously discussed, the first and second latch circuits 102 and 104 receive the clock_in signal at their clock inputs. In one embodiment of the invention, the clock_in signal is inverted before being input to the clock input of the first latch circuit 102. In the embodiment shown, the first and second latch circuits 102 and 104 receive a high logic signal (i.e., a logic 1) at their q or data inputs.

The clock generation circuit 100 does not include an extra selector, such as the selector 50 of the prior art circuit 100. Accordingly, there is no latency added by including the additional selector. Further, the clock generation circuit 100 allows for increased test coverage over the circuit 40 because the buffers 114 are testable and the multiplexer 106 has at least partial test coverage.

While a presently preferred embodiment of the invention has been illustrated and described, it will be clear that the invention is not limited to this embodiment only. Numerous modifications, changes, variations, substitutions, and equivalents will be apparent to those skilled in the art, without departing from the spirit and scope of the invention, as described in the claims.

The invention claimed is:

1. A clock generation circuit that receives an input clock signal and generates an output clock signal, the clock generation circuit comprising:

a first latch circuit that receives the input clock signal at a clock input thereof;

a second latch circuit that receives the input clock signal at a clock input thereof;

a first plurality of buffers connected in series, wherein a first buffer of the first plurality of buffers receives the input clock signal and a last buffer of the first plurality of buffers outputs a buffered input clock signal;

a second plurality of buffers connected in series, wherein a first buffer of the second plurality of buffers receives an output of the second latch circuit and a last buffer of the second plurality of buffers outputs a divided clock signal;

a selector circuit that receives at first and second data inputs respectively, the buffered input clock signal and the divided clock signal, and at a control input thereof a selector control signal, wherein an output of the selector circuit is the output clock signal; and a logic gate having a first input connected to an output of the first latch circuit and a second input that receives a scan mode signal, wherein an output of the logic gate is the selector control signal.

2. The clock generation circuit of claim 1, wherein the logic gate performs a logic OR operation.

3. The clock generation circuit of claim 1, wherein the first plurality of buffers comprises two buffers connected in series.

4. The clock generation circuit of claim 3, wherein the second plurality of buffers comprises two buffers connected in series.

5. The clock generation circuit of claim 4, further comprising a third plurality of series connected buffers connected between the first latch circuit and the logic gate, wherein a first buffer of the third plurality of buffers receives the output of the first latch circuit and a last buffer of the third plurality of buffers is connected to the first input of the logic gate.

6. The clock generation circuit of claim 5, wherein the third plurality of buffers comprises two series connected buffers.

7. The clock generation circuit of claim 1, further comprising an inverter connected between the input clock signal and the clock input of the first latch circuit.

8. A clock generation circuit that receives an input clock signal and generates an output clock signal, the clock generation circuit comprising:
- a first latch circuit that receives the input clock signal at a clock input thereof;
- a second latch circuit that receives the input clock signal at a clock input thereof;
- a first pair of buffers connected in series, wherein a first buffer of the first pair of buffers receives the input clock signal and a second buffer of the first pair of buffers outputs a buffered input clock signal;
- a second pair of buffers connected in series, wherein a first buffer of the second pair of buffers receives an output of the second latch circuit and a second buffer of the second pair of buffers outputs a divided clock signal;
- a third pair of buffers connected in series, wherein a first buffer of the third pair of buffers receives an output of the first latch circuit and the second buffer of the third pair of buffers outputs a select signal;
- a logic gate having a first input connected to an output of the second buffer of the third pair of buffers and a second input that receives a scan mode signal, wherein the logic gate generates a selector control signal; and
- a selector circuit that receives at first and second data inputs respectively, the buffered input clock signal and the divided clock signal, and at a control input thereof the selector control signal, wherein an output of the selector circuit is the output clock signal.

9. The clock generation circuit of claim 8, wherein the logic gate performs a logic OR operation.

\* \* \* \* \*